United States Patent
Di et al.

(10) Patent No.: US 9,601,337 B2
(45) Date of Patent: Mar. 21, 2017

(54) MANUFACTURING METHOD OF GRAPHENE MODULATED HIGH-K OXIDE AND METAL GATE MOS DEVICE

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Zengfeng Di, Shanghai (CN); Xiaohu Zheng, Shanghai (CN); Gang Wang, Shanghai (CN); Miao Zhang, Shanghai (CN); Xi Wang, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 14/423,234

(22) PCT Filed: Feb. 21, 2014

(86) PCT No.: PCT/CN2014/072343
§ 371 (c)(1),
(2) Date: Feb. 23, 2015

(87) PCT Pub. No.: WO2014/146528
PCT Pub. Date: Sep. 25, 2014

(65) Prior Publication Data
US 2016/0005609 A1    Jan. 7, 2016

(30) Foreign Application Priority Data
Mar. 22, 2013  (CN) .......................... 2013 1 0095306

(51) Int. Cl.
*H01L 21/66*      (2006.01)
*H01L 21/28*      (2006.01)
(Continued)

(52) U.S. Cl.
CPC .... *H01L 21/28255* (2013.01); *H01L 21/0234* (2013.01); *H01L 21/02115* (2013.01);
(Continued)

(58) Field of Classification Search
CPC ......... H01L 21/28255; H01L 21/02115; H01L 21/02181; H01L 21/0227; H01L 21/02321;
(Continued)

(56) References Cited

U.S. PATENT DOCUMENTS

2007/0170541 A1* 7/2007 Chui ................. H01L 21/28255
257/506
2011/0114918 A1* 5/2011 Lin ..................... H01L 29/1606
257/24

(Continued)

*Primary Examiner* — Tod T Van Roy
*Assistant Examiner* — Vu A Vu
(74) *Attorney, Agent, or Firm* — Global IP Services; Tianhua Gu

(57) ABSTRACT

A manufacturing method of a graphene modulated high-k oxide and metal gate Ge-based MOS device, which comprises the following steps: 1) introducing a graphene thin film on a Ge-based substrate; 2) conducting fluorination treatment to the graphene thin film to form fluorinated graphene; 3) activating the surface of the fluorinated graphene by adopting ozone plasmas, and then forming a high-k gate dielectric on the surface of the fluorinated graphene through an atomic layer deposition technology; and 4) forming a metal electrode on the surface of the high-k gate dielectric. Since the present invention utilizes the graphene as a passivation layer to inhibit the formation of unstable oxide $GeO_x$ on the surface of the Ge-based substrate and to stop mutual diffusion between the gate dielectric and the (Continued)

Ge-based substrate, the interface property between Ge and the high-k gate dielectric layer is improved. The fluorinated graphene can enable the graphene to become a high-quality insulator on the basis of keeping the excellent property of the graphene, so that the influence thereof on the electrical property of the Ge-based device is reduced. By adopting the ozone plasmas to treat the Ge-based graphene and then by adopting the atomic layer deposition technology, an ultrathin Hf-based high-k gate dielectric layer can be obtained.

8 Claims, 4 Drawing Sheets

(51) Int. Cl.
  *H01L 29/423*   (2006.01)
  *H01L 29/66*   (2006.01)
  *H01L 29/778*   (2006.01)
  *H01L 29/16*   (2006.01)
  *H01L 21/02*   (2006.01)
  *H01L 21/265*   (2006.01)
  *H01L 21/285*   (2006.01)
  *H01L 21/324*   (2006.01)
  *H01L 29/51*   (2006.01)
  *H01L 29/78*   (2006.01)

(52) U.S. Cl.
  CPC .. *H01L 21/02181* (2013.01); *H01L 21/02271* (2013.01); *H01L 21/02321* (2013.01); *H01L 21/02381* (2013.01); *H01L 21/26513* (2013.01); *H01L 21/2855* (2013.01); *H01L 21/324* (2013.01); *H01L 29/16* (2013.01); *H01L 29/1606* (2013.01); *H01L 29/42364* (2013.01); *H01L 29/513* (2013.01); *H01L 29/517* (2013.01); *H01L 29/6659* (2013.01); *H01L 29/66431* (2013.01); *H01L 29/66477* (2013.01); *H01L 29/7781* (2013.01); *H01L 29/7833* (2013.01); *H01L 22/14* (2013.01)

(58) Field of Classification Search
  CPC ........... H01L 21/0234; H01L 21/02381; H01L 21/26513; H01L 21/2855; H01L 21/324; H01L 22/14; H01L 29/16; H01L 29/513; H01L 29/517
  USPC .......................................................... 438/17
  See application file for complete search history.

(56) References Cited

U.S. PATENT DOCUMENTS

| | | | | |
|---|---|---|---|---|
| 2011/0244662 | A1* | 10/2011 | Lee | C23C 16/0272 438/478 |
| 2013/0082234 | A1* | 4/2013 | Bao | H01L 51/424 257/9 |
| 2014/0021446 | A1* | 1/2014 | Lee | H01L 29/4908 257/29 |
| 2014/0162433 | A1* | 6/2014 | Willner | H01L 21/0201 438/458 |

* cited by examiner

MANUFACTURING METHOD OF GRAPHENE MODULATED HIGH-K OXIDE AND METAL GATE MOS DEVICE

CROSS REFERENCE TO RELATED PATENT APPLICATION

The present application is the US national stage of PCT/CN2014/072343 filed on Feb. 21, 2014, which claims the priority of the Chinese patent applications No. 201310095306.5 filed on Mar. 22, 2013, which applications are incorporated herein by reference.

BACKGROUND OF THE PRESENT INVENTION

Field of Invention

The present invention relates a manufacturing method of a MOS device, in particular to a manufacturing method of a graphene modulated high-k oxide and metal gate Ge-based MOS device.

Description of Related Arts

After the feature size of semiconductor devices enters the 45 nm technology node and beyond, in order to reduce gate tunneling current, decrease the power consumption of the devices, thoroughly eliminate the problem of poor reliability caused by polysilicon depletion effect and boron penetration in a P-type metal-oxide-semiconductor field effect transistor (MPOSFET) and relieve a Fermi level pinning effect, it has become an inevitable choice to use high dielectric constant (k) oxide and metal gate materials to replace the traditional $SiO_2$/polysilicon structures. However, according to the International Technology Roadmap for Semiconductor (ITRS), the CMOS technology will step into a 16 nm technology node in 2015-2020. The scaling-down of CMOS logical devices will be confronted with more challenges. In order to overcome these obstacles caused by size scaling-down, the most advanced process technologies need to be integrated into the product manufacturing process. According to the current development trend, application of new technologies which will be introduced into the 16 nm technology node involves the following several aspects: immersion lithography extended technology, mobility enhanced substrate technology, ultra-shallow junction (USJ) and other strain enhancement engineering methods, wherein increasingly extensive attention is paid to the mobility enhanced substrate technology. Due to extremely high carrier mobility and compatibility with semiconductor process, germanium (Ge) is considered as the most potential high-mobility semiconductor material. The band gap width of germanium is 0.66 eV, the electron mobility and the hole mobility are respectively 2.6 times and 4.2 times of that of Si, the mobility can also be further improved through the strain enhancement technology, and thus germanium is an ideal channel material for the next generation CMOS devices. However, the properties of the oxides of Ge are different from that of the oxides of Si, and $GeO_2$ easily absorbs water molecule at normal temperature and becomes instable. Moreover, when temperature rises, $GeO_2$ reacts with Ge to produce GeO, so that the high-k/Ge structure interface is caused to be instable under the MOS process. In addition, serious mutual diffusion easily occurs on the high-k/Ge interface, so that problems such as decreasing in performance of the dielectric layer and serious current leakage in the gate of the device are also caused.

In consideration of the challenges confronted by the high-k/Ge interface structure, graphene is considered as one of the most stable two-dimension materials and has ultrahigh flexibility and mechanical strength. According to the latest studies, graphene not only has ultrahigh carrier mobility, but also has a very good passivation effect. Through studies, it is found that metal materials can be favorably prevented from being oxidized by growing graphene on the surface of copper or copper-nickel alloy through the chemical vapor deposition method. By introducing graphene between Ni, Al, Au and the Si substrate, it can be used as the passivation layer under the condition of high temperature to favorably inhibit atom diffusion between different thin layers. In addition, according to studies, the conductor property of graphene can be transitioned to semiconductor and even insulator through H, O or F plasma treatment. Therefore, by introducing a plasma treated graphene barrier layer between the high-k gate dielectric material and the germanium substrate, it is promising to solve the problems of the production of instable $GeO_x$ and the mutual diffusion between Ge and the high-k oxide without influencing the property of channels. The research result will expand the application field of graphene materials and push the microelectronic technology to continuously develop according to Moore's law.

SUMMARY OF THE PRESENT INVENTION

In view of the disadvantages described above in the prior art, the purpose of the present invention is to provide a manufacturing method of a graphene modulated high-k oxide and metal gate Ge-based MOS device, so as to solve the problems of the production of instable $GeO_x$ and the mutual diffusion between Ge and the high-k metal gate in the prior art.

In order to realize the above-mentioned purpose and other related purposes, the present invention provides the manufacturing method of the graphene modulated high-k oxide and metal gate Ge-based MOS device, which at least comprises the following steps:

1) introducing a graphene thin film on a Ge-based substrate;

2) conducting fluorination treatment to the graphene thin film to form a fluorinated graphene insulating thin layer;

3) activating the surface of the fluorinated graphene by adopting ozone plasmas, and then forming a high-k gate dielectric on the surface of the fluorinated graphene through an atomic layer deposition technology;

4) forming a metal electrode on the surface of the high-k gate dielectric;

As a preferred solution of the manufacturing method of the graphene modulated high-k oxide and metal gate Ge-based MOS device of the present invention, the manufacturing method further comprises the following steps:

5) removing part of the metal electrode, the high-k gate dielectric and the fluorinated graphene to form the gate structure of the MOS device;

6) forming a source region and a drain region through an ion implantation technology;

7) manufacturing a source region electrode and a drain region electrode.

As a preferred solution of the manufacturing method of the graphene modulated high-k oxide and metal gate Ge-based MOS device of the present invention, the step 1 comprises the following steps:

1-1) growing the graphene thin film on the metal substrate;

1-2) transferring the graphene thin film onto the Ge-based substrate;

1-3) annealing to enhance the bonding of the graphene thin film and the Ge-based substrate.

As a preferred solution of the manufacturing method of the graphene modulated high-k metal gate Ge-based MOS device of the present invention, in the step 1, a chemical vapor deposition method is adopted to grow the graphene thin film in situ on the surface of the Ge-based substrate.

As a preferred solution of the manufacturing method of the graphene modulated high-k oxide and metal gate Ge-based MOS device of the present invention, in the step 2, $XeF_2$ gas is adopted to conduct plasma fluorination treatment to the graphene thin film.

As a preferred solution of the manufacturing method of the graphene modulated high-k oxide and metal gate Ge-based MOS device of the present invention, the material of the high-k gate dielectric is an Hf-based dielectric.

As a preferred solution of the manufacturing method of the graphene modulated high-k oxide and metal gate Ge-based MOS device of the present invention, in the step 4, a physical vapor deposition method is adopted to form the metal electrode, wherein the metal electrode is a Pt electrode.

As a preferred solution of the manufacturing method of the graphene modulated high-k oxide and metal gate Ge-based MOS device of the present invention, after the step 4, the manufacturing method further comprises a step of annealing in an $N_2$ and $O_2$ atmosphere and conducting interface diffusion and electrical property testing.

As described above, the present invention provides the manufacturing method of the graphene modulated high-k oxide and metal gate Ge-based MOS device, which comprises the following steps: 1) introducing a graphene thin film on a Ge-based substrate; 2) conducting fluorination treatment to the graphene thin film to form fluorinated graphene; 3) activating the surface of the fluorinated graphene by adopting ozone plasmas, and then forming a high-k gate dielectric on the surface of the fluorinated graphene through an atomic layer deposition technology; 4) forming a metal electrode on the surface of the high-k gate dielectric. The present invention has the following beneficial effects: 1) since the graphene is used as a passivation layer to inhibit the production of a $GeO_x$ intermediate layer, to stop mutual diffusion of interface atoms and to modulate the interface property of a $HfO_2$/Ge stacked structure, and the two-dimensional material property of graphene is utilized to effectively control the EOT of the dielectric layer of the MOS device; 2) the excellent property of $HfO_2$ as a dielectric material and the ultrahigh mobility characteristic of Ge as a substrate material are integrated; and 3) since graphene is transitioned from a conductor to an insulator by conducting fluorination treatment to graphene, the influence of the graphene passivation layer on the channel property is reduced; and by adopting ozone plasmas to treat the Ge-based graphene, necessary conditions are provided for the growth of ultrathin $HfO_2$.

DESCRIPTION OF REFERENCE NUMBERS OF ELEMENTS

Figure 1A:
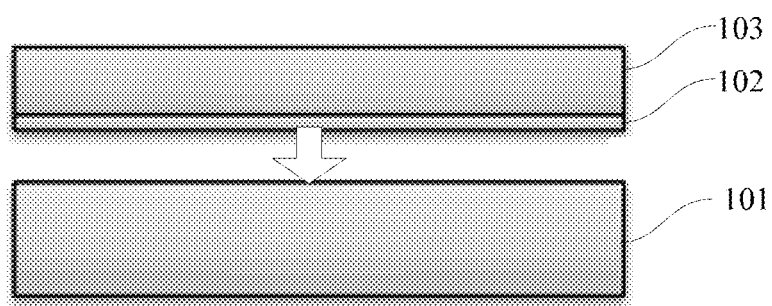
FIG. 1a to FIG. 2b respectively show a structural schematic view represented by the step 1 of the manufacturing method of the graphene modulated high-k oxide and metal gate Ge-based MOS device of the present invention.

101 Ge-based substrate
102 Graphene thin film
103 PMMA base
104 $CH_4$
105 $H_2$
106 Fluorinated grapheme
107 High-k gate dielectric
108 Metal electrode
109 Source region
110 Drain region
111 Source region electrode
112 Drain region electrode

DETAILED DESCRIPTION OF THE PREFERRED EMBODIMENTS

The implementation mode of the present invention is described below through specific embodiments. One skilled in the art can easily understand other advantages and effects of the present invention according to the contents disclosed by the description. The present invention can be implemented or applied through other different specific implementation modes, various details in the description can also be based on different viewpoints and applications, various modifications or changes can be made without departing from the spirit of the present invention.

Please refer to FIG. 1a to FIG. 9. It is to be noted that the views provided in this embodiment are only exemplary to describe the basic concept of the present invention, thus the drawings only show components related to the present invention and are not drawn according to component number, shape and size during actual implementation, the form, number and proportion of each component during actual implementation can be changed freely, and the layout form of the components may be more complex.

As shown in FIG. 1a to FIG. 9, the present invention provides a manufacturing method of a graphene modulated high-k oxide and metal gate Ge-based MOS device, which at least comprises the following steps:

As shown in FIG. 1a to FIG. 2b, the method begins with step 1) introducing a graphene thin film 102 on a Ge-based substrate 101.

Figure 1B:
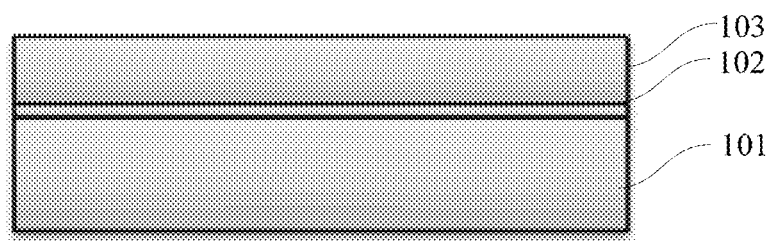
Figure 1C:
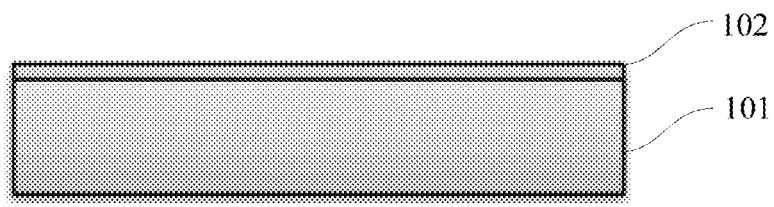

As shown in FIG. 1a to FIG. 1b, in one specific implementation process, the step 1 comprises the following steps:

The process begins with step 1-1) growing the graphene thin film 102 on the metal substrate.

As an example, the metal substrate is a substrate formed of copper or nickel, etc.

Then the process goes into step 1-2) transferring the graphene thin film 102 onto the Ge-based substrate 101.

As an example, firstly the graphene thin film 102 which grows on the metal substrate is transferred to a PMMA base 103, then the graphene thin film 102 is attached onto the surface of the Ge-based substrate 101 through the PMMA base 103, and thereafter, the PMMA base 103 is washed and removed by adopting acetone solution.

Finally the process goes into step 1-3) annealing to enhance the bonding of the graphene thin film 102 and the Ge-based substrate 101.

Figure 2A:
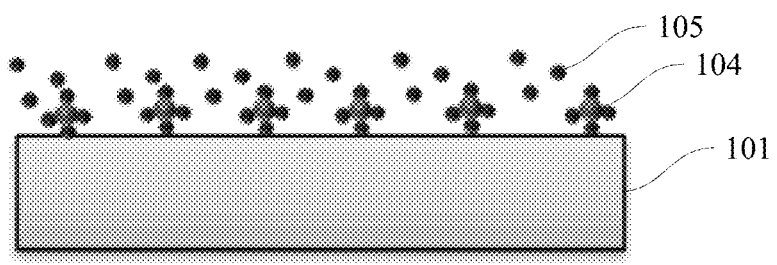
Figure 2B:
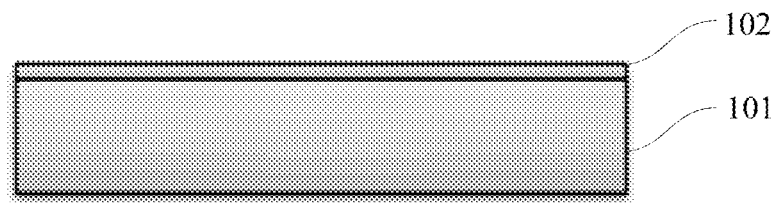

As shown in FIG. 2a to FIG. 2b, in another specific implementation process, in the step 1, a chemical vapor deposition method is adopted to grow the graphene thin film 102 in situ on the surface of the Ge-based substrate 101.

As an example, by using $H_2$ 105 and $CH_4$ 104 as reaction gases, the chemical vapor deposition method is adopted to grow the graphene thin film 102 in situ on the surface of the Ge-based substrate 101 at low temperature.

The graphene thin film 102 can be used as a passivation layer to inhibit the formation of instable oxide $GeO_x$ in the Ge-based substrate and to stop mutual diffusion between the high-k gate dielectric 107 and the Ge-based substrate 101 in future.

Figure 3:
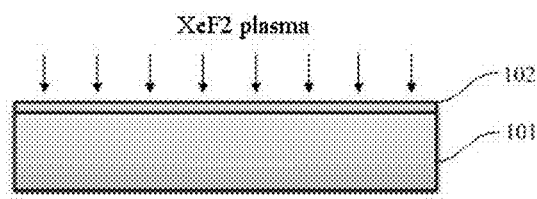
FIG. 3 to FIG. 4 respectively show a structural schematic view represented by the step 2 of the manufacturing method of the graphene modulated high-k oxide and metal gate Ge-based MOS device of the present invention.
Figure 4:
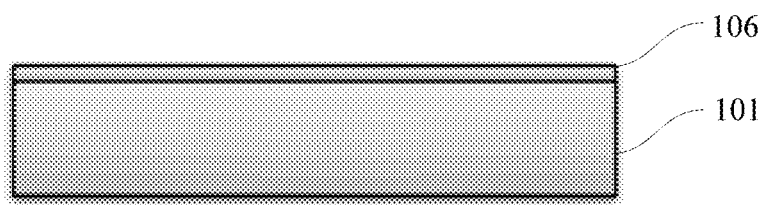

As shown in FIG. 3 to FIG. 4, then the process goes into step 2) conducting fluorination treatment to the graphene thin film 102 to form a fluorinated graphene 106 insulating thin layer.

As an example, the graphene thin film 102 is placed in plasma equipment, and ionized $XeF_2$ gas is adopted to conduct plasma fluorination treatment to the graphene thin film 102 to form the fluorinated graphene 106 insulating thin layer.

The fluorinated graphene 106 can enable the graphene to become a high-quality insulator on the basis of keeping relevant excellent property of the graphene, and the influence of the graphene on the electrical property of a Ge channel material can be reduced by conducting fluorination treatment to the graphene by adopting plasmas.

Figure 5:
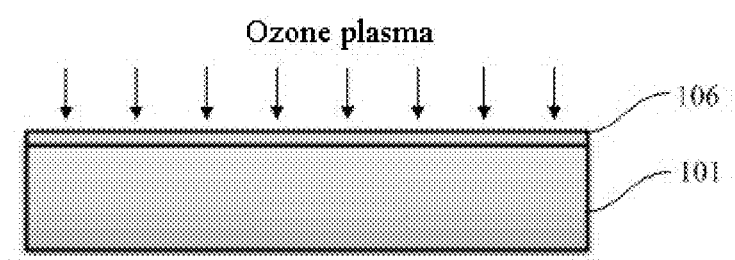
FIG. 5 to FIG. 6 respectively show a structural schematic view represented by the step 3 of the manufacturing method of the graphene modulated high-k oxide and metal gate Ge-based MOS device of the present invention.
Figure 6:
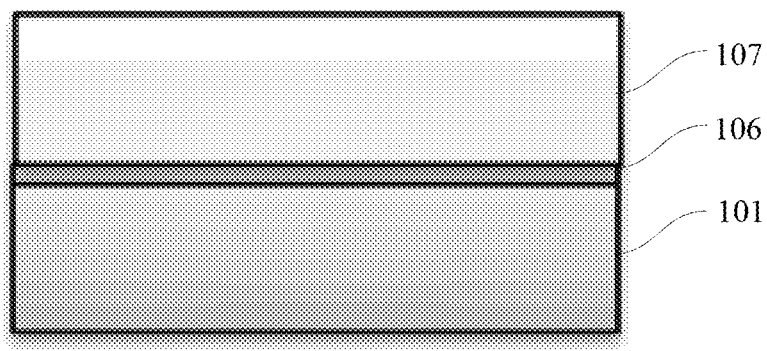

As shown in FIG. 5 to FIG. 6, then the process goes into step 3) activating the surface of the fluorinated graphene 106 by adopting ozone plasmas, and then forming a high-k gate dielectric 107 on the surface of the fluorinated graphene 106 through an atomic layer deposition technology.

As an example, the material of the high-k gate dielectric 107 is a Hf-based dielectric. In this embodiment, the material of the high-k gate dielectric 107 is $HfO_2$. Of course, in other embodiments, the high-k gate dielectric 107 can also be HfON, HfAlO, HfAlON, HfTaO, HfTaON, HfSiO, HfSiON, HfLaO or HfLaON, etc.

Since the graphene is a two-dimensional material, it is difficult to deposit a high-quality metal oxide layer thereon by adopting the atomic layer deposition (ALD) technology. However, by adopting ozone plasma surface activation technology, dangling bonds can be produced on the surface of the graphene, so that necessary conditions are provided for subsequent ALD precursor surface adsorption to obtain a high-quality ultrathin high-k gate dielectric 107 layer.

Figure 7:
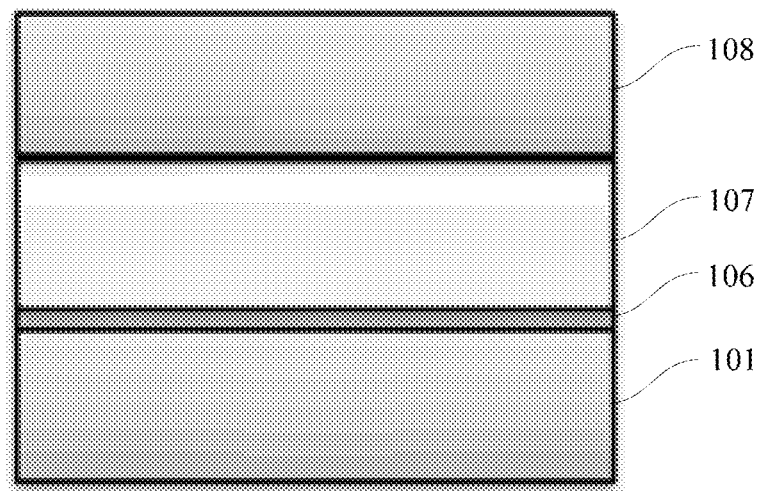
FIG. 7 to FIG. 8 respectively show a structural schematic view represented by the step 4 of the manufacturing method of the graphene modulated high-k oxide and metal gate Ge-based MOS device of the present invention.
Figure 8:
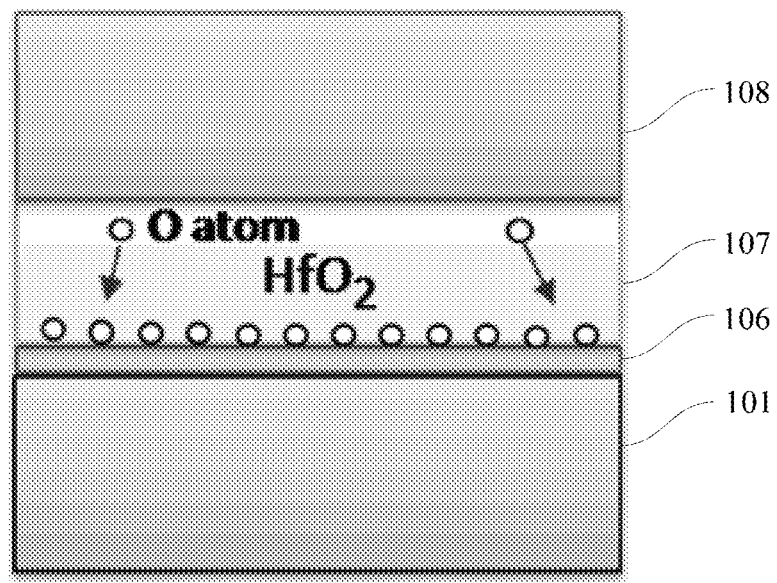

As shown in FIG. 7 to FIG. 8, finally the process goes into step 4) forming a metal electrode 108 on the surface of the high-k gate dielectric 107.

As an example, the physical vapor deposition technology is adopted to form the metal electrode 108, and the metal electrode 108 is a Pt electrode. Of course, the metal electrode 108 can also be a substrate of other metals such as Au, Ti and etc.

As an example, after the step 4, the manufacturing method further comprises a step of annealing in an $N_2$ and $O_2$ atmosphere and conducting interface diffusion and electrical property testing. This step can be used for researching on the diffusion behavior and relevant electrical properties of the Hf-based high-k oxide and metal gate and Ge interface. Specifically, after conventional MOS process annealing is adopted, a high resolution transmission electron microscopy can be adopted to characterize a sample interface state, XPS is adopted to conduct deep analysis and research on the distribution situation of elements on the interface before and after annealing, etc.

As shown in FIG. 8, a fluorinated graphene 106 thin film 102 is added in the interface between the high-k oxide and metal gate and the Ge-based substrate 101, so that mutual diffusion of interface atoms can be stopped and the interface property of an $HfO_2$/Ge stacked structure can be modulated. At the same time, by utilizing the two-dimensional material feature of the graphene, the EOT of the dielectric layer of the MOS device can be effectively controlled.

Figure 9:
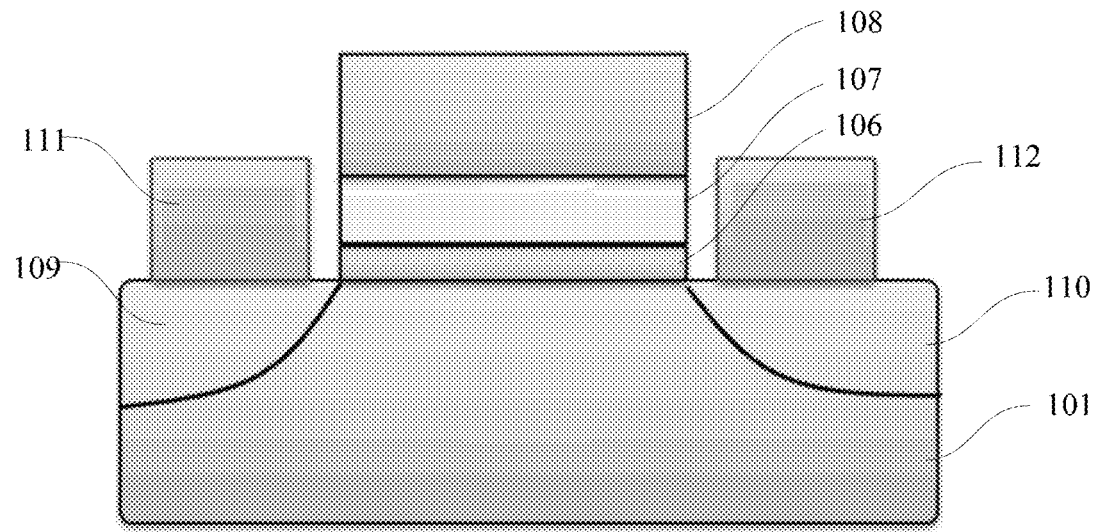
FIG. 9 shows a structural schematic view represented by the steps 5-7 of the manufacturing method of the graphene modulated high-k oxide and metal gate Ge-based MOS device of the present invention.

As shown in FIG. 9, as an example, after the Ge-based substrate 101/fluorinated graphene 106/high-k oxide and metal gate stacked structure is formed, the manufacturing method further comprises steps of forming the MOS device by adopting a conventional MOS technology, and specifically further comprises the following steps:

The process begins with step 5) removing part of the metal electrode 108, the high-k gate dielectric 107 and the fluorinated graphene 106 to form a gate structure of the MOS device.

As an example, a dry etching technology is adopted to form the gate structure.

Then the process goes into step 6) forming a source region 109 and a drain region 110 of the MOS device through an ion implantation technology.

As an example, firstly a lightly doped drain (LDD) can be formed through the ion implantation technology and an annealing technology.

As an example, protective side wall structures such as silicone oxide and silicon nitride can be formed on the side walls of the gate structure.

As an example, the MOS device can be a PMOS, NMOS or CMOS device. Different types of MOS devices can be realized through different types of ion implantation.

Finally the process goes into step 7) manufacturing a source region electrode 111 and a drain region electrode 112.

As an example, the source region electrode 111 and the drain region electrode 112 can be formed through a direct sputtering or electroplating technology and metal germanide can also be formed through annealing after deposition and be used as electrodes.

To sum up, the present invention provides the manufacturing method of the graphene modulated high-k oxide metal gate Ge-based MOS device, which comprises the following steps: 1) introducing a graphene thin film 101 on a Ge-based substrate 102; 2) conducting fluorination treatment to the graphene thin film 102 to form fluorinated graphene 106; 3) activating the surface of the fluorinated graphene 106 by adopting ozone plasmas, and then forming a high-k gate dielectric 107 on the surface of the fluorinated graphene 106 through an atomic layer deposition technology; 4) forming a metal electrode 108 on the surface of the high-k gate dielectric 107. The present invention has the following beneficial effects: 1) since the graphene is used as a passivation layer to inhibit the production of a $GeO_x$ intermediate layer, to stop mutual diffusion of interface atoms and to modulate the interface property of a $HfO_2$/Ge stacked structure, and the two-dimensional material property of graphene is utilized, the EOT of the dielectric layer of the MOS device is effectively controlled; 2) the excellent property of $HfO_2$ as a dielectric material and the ultrahigh mobility feature of Ge as a substrate material are integrated; and 3) since graphene is transitioned from a conductor to an insulator by conducting fluorination treatment to graphene, the influence of the graphene passivation layer on the channel property is reduced; and by adopting ozone plasmas to treat the Ge-based graphene, necessary conditions are provided for the growth of ultrathin $HfO_2$. Therefore, the present invention effectively overcomes various disadvantages in the prior art and has a great industrial application value.

The above-mentioned embodiments are only exemplary to describe the principle and the effect of the present invention but not to limit the present invention. Those familiar with the art can make modifications or changes to the above-mentioned embodiments without departing from the spirit and the scope of the present invention. Therefore, all equivalent modifications or changes made by those of common knowledge in the art without departing from the spirit and the technical idea disclosed by the present invention shall still be covered by the claims of the present invention.

What is claimed is:

1. A manufacturing method of a graphene modulated high-k oxide and metal gate Ge-based MOS device, characterized in that the manufacturing method at least comprises the following steps:
   1) introducing a graphene thin film on a Ge-based substrate, the graphene thin film is used as a passivation layer to inhibit the formation of instable oxide GeOx in the Ge-based substrate and to stop mutual diffusion between the high-k gate dielectric and the Ge-based substrate;
   2) conducting fluorination treatment to the graphene thin film to form a fluorinated graphene insulating thin layer;
   3) activating the surface of the fluorinated graphene by adopting ozone plasmas, and then forming a high-k gate dielectric on the surface of the fluorinated graphene through an atomic layer deposition technology;
   4) forming a metal electrode on the surface of the high-k gate dielectric.

2. The manufacturing method of the graphene modulated high-k oxide and metal gate Ge-based MOS device according to claim 1, characterized in that the manufacturing method further comprises the following steps:
   5) removing part of the metal electrode, the high-k gate dielectric and the fluorinated graphene to form a gate structure of the MOS device;
   6) forming a source region and a drain region through an ion implantation technology;
   7) manufacturing a source region electrode and a drain region electrode.

3. The manufacturing method of the graphene modulated high-k oxide and metal gate Ge-based MOS device according to claim 1, characterized in that the step 1 comprises the following steps:
   1-1) growing the graphene thin film on the metal substrate;
   1-2) transferring the graphene thin film onto the Ge-based substrate;
   1-3) annealing to enhance the bonding of the graphene thin film and the Ge-based substrate.

4. The manufacturing method of the graphene modulated high-k oxide and metal gate Ge-based MOS device according to claim 1, characterized in that, in the step 1, a chemical vapor deposition method is adopted to grow the graphene thin film in situ on the surface of the Ge-based substrate.

5. The manufacturing method of the graphene modulated high-k oxide and metal gate Ge-based MOS device according to claim 1, characterized in that, in the step 2, $XeF_2$ gas is adopted to conduct plasma fluorination treatment to the graphene thin film.

6. The manufacturing method of the graphene modulated high-k oxide and metal gate Ge-based MOS device according to claim 1, characterized in that the material of the high-k gate dielectric is an Hf-based dielectric.

7. The manufacturing method of the graphene modulated high-k oxide and metal gate Ge-based MOS device according to claim 1, characterized in that, in the step 4, a physical vapor deposition method is adopted to form the metal electrode, wherein the metal electrode is a Pt electrode.

8. The manufacturing method of the graphene modulated high-k oxide and metal gate Ge-based MOS device according to claim 1, characterized in that, after the step 4, the manufacturing method further comprises a step of annealing in an $N_2$ and $O_2$ atmosphere and conducting interface diffusion and electrical property testing.

* * * * *